United States Patent
Pergande

(10) Patent No.: US 10,600,662 B2
(45) Date of Patent: Mar. 24, 2020

(54) SILICON CARBIDE SUBSTRATE HEATING

(71) Applicant: Varian Semiconductor Equipment Associates, Inc., Gloucester, MA (US)

(72) Inventor: Paul E. Pergande, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/040,661

(22) Filed: Jul. 20, 2018

(65) Prior Publication Data

US 2020/0027762 A1 Jan. 23, 2020

(51) Int. Cl.
| H01L 21/324 | (2006.01) |
| H01L 21/67 | (2006.01) |
| H01L 21/04 | (2006.01) |

(52) U.S. Cl.
CPC .... *H01L 21/67115* (2013.01); *H01L 21/0445* (2013.01); *H01L 21/324* (2013.01)

(58) Field of Classification Search
CPC .......... H01L 21/67115; H01L 21/0445; H01L 21/324
USPC ................ 250/492.1, 493.1, 494.1
See application file for complete search history.

(56) References Cited

U.S. PATENT DOCUMENTS

| 6,818,864 B2 | 11/2004 | Ptak |
| 9,287,148 B1 | 3/2016 | Evans et al. |
| 9,666,769 B2 | 5/2017 | Osaki et al. |
| 10,028,336 B2 | 7/2018 | Aoyama et al. |
| 2012/0325795 A1* | 12/2012 | Suzuki ............. H01L 21/67109 219/209 |
| 2013/0326941 A1 | 12/2013 | Pickett et al. |
| 2015/0023385 A1* | 1/2015 | Patalay ............. H01L 21/67248 374/1 |
| 2016/0293458 A1 | 10/2016 | Schaller et al. |
| 2016/0329458 A1* | 11/2016 | Evans ....................... F26B 3/30 |

FOREIGN PATENT DOCUMENTS

| JP | 2008-16691 A | 1/2008 |
| WO | 2008/030663 A1 | 3/2008 |

OTHER PUBLICATIONS

International Search Report and Written Opinion dated Oct. 29, 2019 in corresponding PCT application No. PCT/US2019/041286.

\* cited by examiner

*Primary Examiner* — Nicole M Ippolito
(74) *Attorney, Agent, or Firm* — Nields, Lemack & Frame, LLC

(57) ABSTRACT

A system and method for heating silicon carbide substrates is disclosed. The system includes a heating element that utilizes LEDs that emit light at wavelengths between 600 nm and 650 nm. This wavelength is better absorbed by silicon carbide. In certain embodiments, collimating optics are disposed between the LEDs and the silicon carbide substrate. The collimating optics may increase the allowable distance between the LEDs and the substrate. In other embodiments, a diffuser is disposed between the LEDs and the substrate. In addition, a method of heating a substrate is disclosed. The relationship between absorption coefficient and wavelength is determined for the substrate. Based on this relationship, an optimal wavelength or range of wavelengths is selected. The substrate is then heated using an LED emitting light at the optimal wavelengths.

19 Claims, 7 Drawing Sheets

SILICON CARBIDE SUBSTRATE HEATING

FIELD

Embodiments of the present disclosure relate to systems and methods that utilize an LED array to heat a substrate, and more particularly, to a red LED array to heat a silicon carbide substrate.

BACKGROUND

The fabrication of a semiconductor device involves a plurality of discrete and complex processes. In certain processes, it may be advantageous to heat the substrate so that the process achieves the desired result. One method of heating the substrate is through the use of light emitting diodes (LEDs). In many instances, LEDs are fabricated using gallium and nitrogen (GaN) or indium nitride and gallium nitride (InGaN). These LEDs emit light at a wavelength that is related to the bandgap energy between the p-type material and the n-type material. Thus, for LEDs fabricated using GaN and InGaN, the wavelengths tend to be about 450-500 nm.

Advancements in this technology, including discoveries in the appropriate doping of indium in the gallium nitride led to the development of high brightness blue LEDs. These high brightness blue LEDs have found application in a wide range of industries, including automotive headlights and household light bulbs.

Advantageously, the wavelengths emitted by blue LEDs are also readily absorbed by silicon. In fact, the absorption coefficient of silicon decreases with increasing wavelength. Thus, arrays of blue LEDs have been used to preheat silicon substrates prior to processing the silicon substrate.

However, some substrate used for fabricating semiconductors are not made of silicon. These other semiconductor substrates may not readily absorb blue light in the same efficient manner done by silicon. Therefore, it would be beneficial if there were a heating system that is tailored with the substrate being processed. More particularly, it would be advantageous if there were a system for more efficiently heating silicon carbide substrates and other non-silicon substrates.

SUMMARY

A system and method for heating silicon carbide substrates is disclosed. The system includes a heating element that utilizes LEDs that emit light at wavelengths between 600 nm and 650 nm. This wavelength is better absorbed by silicon carbide. In certain embodiments, collimating optics are disposed between the LEDs and the silicon carbide substrate. The collimating optics may increase the allowable distance between the LEDs and the substrate. In other embodiments, a diffuser is disposed between the LEDs and the substrate. In addition, a method of heating a substrate is disclosed. The relationship between absorption coefficient and wavelength is determined for the substrate. Based on this relationship, an optimal wavelength or range of wavelengths is selected. The substrate is then heated using an LED emitting light at the optimal wavelengths.

According to one embodiment, a heating system is disclosed. The heating system comprises a silicon carbide substrate; and a heating element, wherein the heating element comprises one or more light emitting diodes (LEDs) that emits light at a wavelength between 600 nm and 650 nm. In certain embodiments, the heating element comprises a plurality of hexagon shaped tiles, each tile comprising a plurality of LEDs. In some further embodiments, each of the plurality of hexagon shaped tiles is calibrated such that all of the plurality of hexagon shaped tiles emits an equal amount of light. In certain embodiments, the LEDs are packaged in a chip scale package. In certain embodiments, collimating optics is disposed between the silicon carbide substrate and the LEDs. In some further embodiments, the collimating optics is integrated with the LEDs. In certain embodiments, a diffuser is disposed between the heating element and the silicon carbide substrate. In certain embodiments, the silicon carbide substrate is disposed in a processing chamber. In some embodiments, the heating element is disposed in the processing chamber. In other embodiments, the processing chamber comprises a surface having a window, and the heating element is disposed outside the processing chamber, proximate the window.

According to another embodiment, a method of heating a substrate is disclosed. The method comprises determining an absorption coefficient of the substrate, wherein the substrate is not a silicon substrate, as a function of wavelength; selecting an optimal wavelength or range of wavelengths based on the determining; and heating the substrate using an LED or LED array that emits light at the optimal wavelength or range of wavelengths. In certain embodiments, the substrate comprises silicon carbide. In certain embodiments, the method further comprises disposing collimating optics between the LED or LED array and the substrate. In some further embodiments, the collimating optics is integrated with the LED or LED array. In some embodiments, the method further comprises disposing a diffuser between the LED or LED array and the substrate.

According to another embodiment, a heating system is disclosed. The heating system comprises a processing chamber adapted to hold a silicon carbide substrate; and a plurality of hexagon shaped tiles, each tile comprising a plurality of LEDs, wherein the plurality of LEDs emit light at a wavelength between 600 nm and 650 nm. In certain embodiments, collimating optics are disposed between the plurality of LEDS and the silicon carbide substrate. In certain embodiments, the plurality of hexagon shaped tiles is disposed outside the processing chamber.

BRIEF DESCRIPTION OF THE FIGURES

For a better understanding of the present disclosure, reference is made to the accompanying drawings, which are incorporated herein by reference and in which.

DETAILED DESCRIPTION

As described above, blue light emitted from GaN and InGaN LEDs is commonly used to heat semiconductor substrates, and more particularly silicon substrates. The high power emitted by these LEDs, their high efficiency, and their ready availability make these blue LEDs the most popular and commercially viable choice for heating elements.

However, blue LEDs may not be optimal for all types of semiconductor substrates. As an example, in certain applications, a silicon carbide substrate may be preferable. For example, certain properties of SiC may make it a preferred semiconductor material for short wavelength optoelectronic, high temperature, radiation resistant, and high-power/high-frequency electronic devices. Silicon carbide may be fabricated in several lattice structures. These may be referred to as 2H—SiC, 4H—SiC, and 6H—SiC. These variations differ in the configuration of the bonds between atoms in the lattice.

Figure 1:
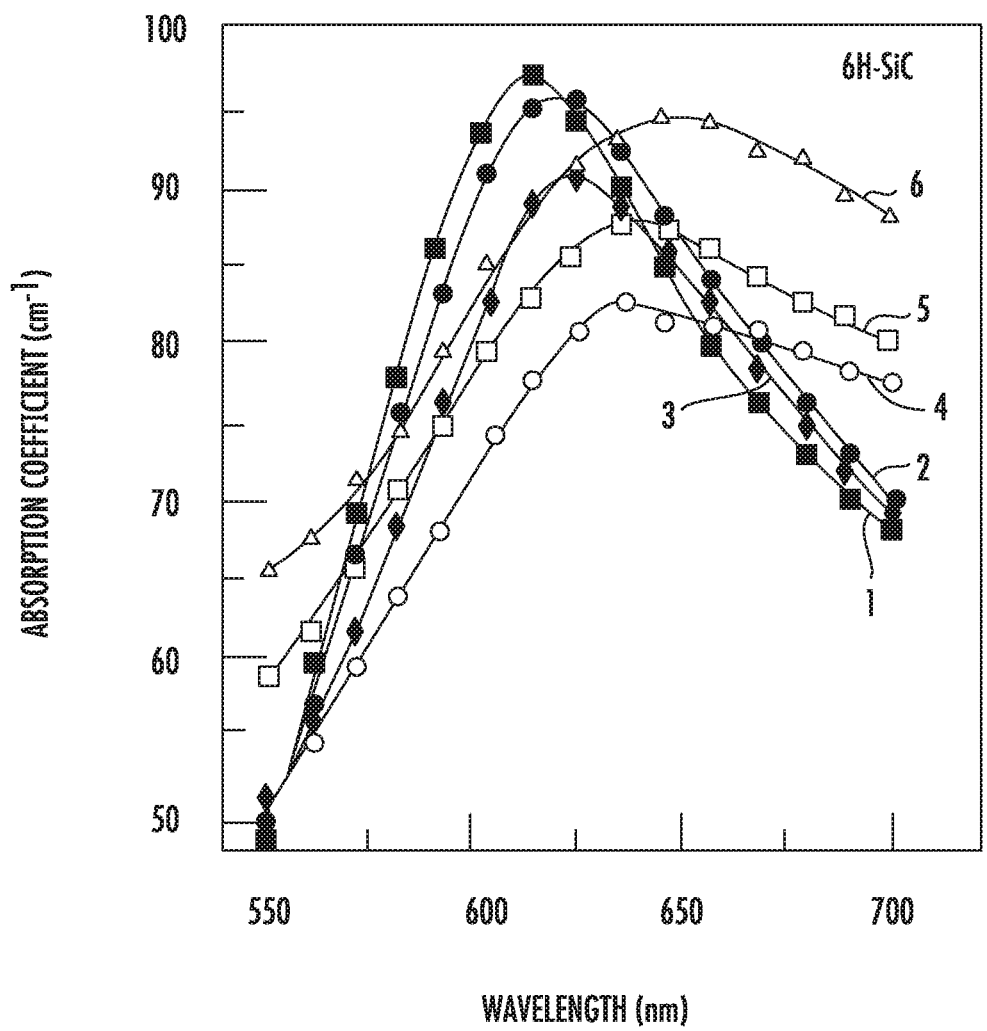
FIG. 1 is a graph showing the absorption coefficient of silicon carbide as a function of wavelength.

Unlike silicon, the absorption coefficient of silicon carbide does not decrease with increasing wavelength. FIG. 1 shows the absorption coefficient of 6H—SiC for a variety of temperatures. Line 1 represents 80K; Line 2 represents 300 K; Line 3 represents 450 K; Line 4 represents 640 K; Line 5 represents 930 K; and Line 6 represents 1100 K.

As can be readily seen in FIG. 1, silicon carbide, unlike silicon, displays a greater absorption coefficient in the range of 600-650 nm than in other ranges.

However, this range is not the range of wavelengths that are emitted by blue LEDs. Rather, this range of wavelengths represents orange and red.

In fact, silicon carbide absorbs about twice as much light energy in the 600-650 nm range than it does in the 450 nm range. Thus, by using red LEDs, either the silicon carbide substrate can be heated much faster with the same light power or a lower light power can be used to achieve the same results as blue LEDs. This results in more efficient coupling between the heating element and the silicon carbide substrate.

Red LEDs may be fabricated from aluminum gallium arsenide (AlGaAs), gallium arsenide phosphide (GaAsP), aluminum gallium indium phosphide (AlGaInP) or gallium phosphide (GaP). Of course, other semiconductors may also be used to fabricate these LEDs. The method of fabrication and the materials used to create the red LEDs is not limited by this disclosure.

Figure 2:
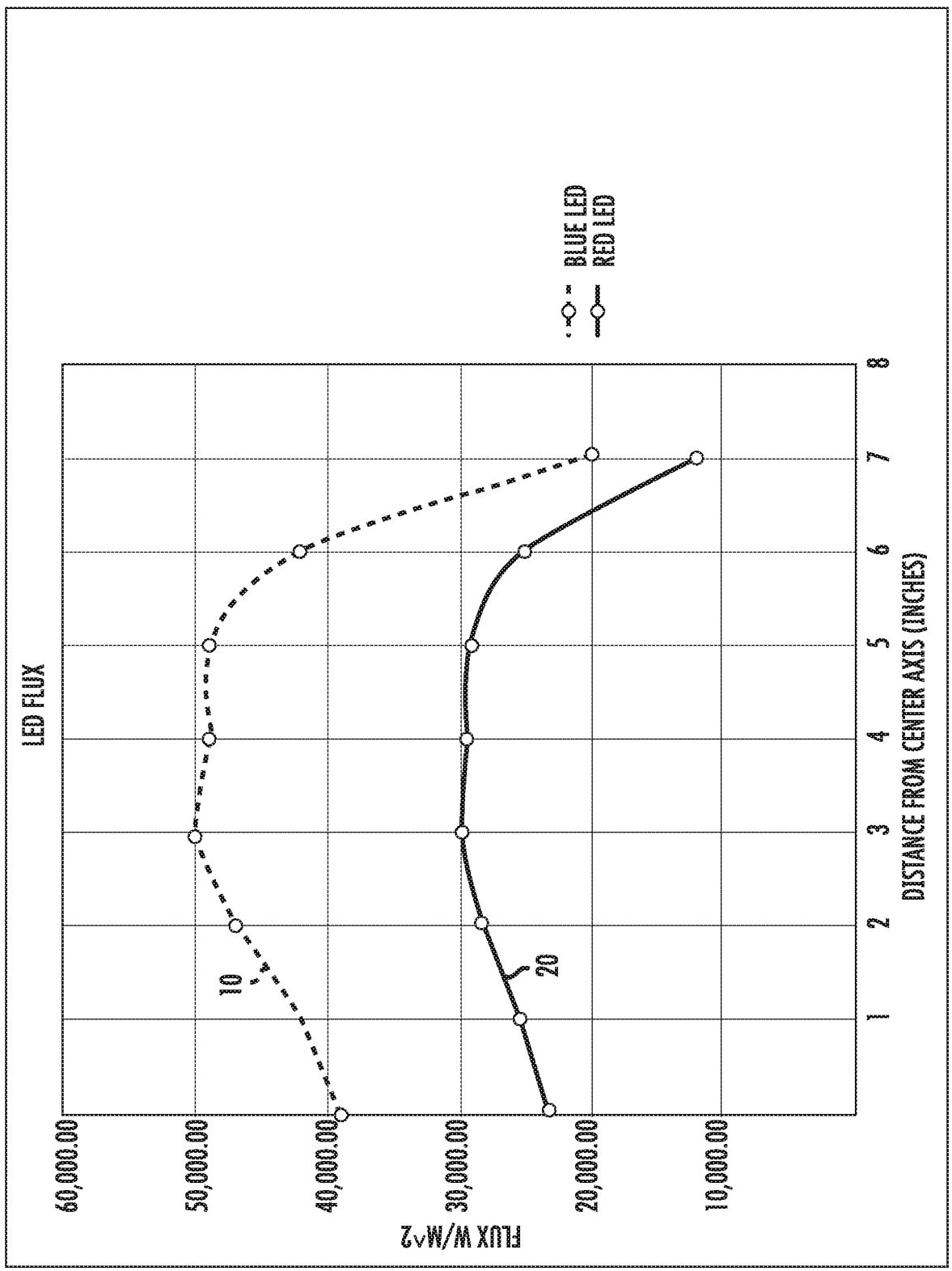
FIG. 2 shows the flux on the silicon carbide substrate as a function of distance from center for blue and red light.

Further, it is estimated that for a given electrical power, a red LED emits about 60% of the light as a blue LED. FIG. 2 shows a graph showing the light flux (or illuminance) as a function of distance from the center of the LED array. The vertical axis represents watts per square meter, while the horizontal represents distance from the center of the substrate in inched. Line 10 shows the light flux emitted by a blue LED as a function of distance from center of the LED array. As stated above, red LEDs emit about 60% of the light at a given input power. Line 20 represents the light flux emitted by a red LED as a function of distance from center of an LED array.

Note that while line 20 peaks at about 30,000 W/m², the increased absorption of the silicon carbide substrate actually implies that more light is absorbed by the silicon carbide substrate.

Thus, a heating element 50 can be created that is comprised of one or more red LEDs.

The red LEDs can be packaged in a variety of ways. For example, in certain embodiments, the red LEDs may be packaged as single die, where each die comprises a single LED. In another embodiment, the red LEDs may be packaged using Chip on Board (COB) technology. In this embodiment, multiple LED die are packaged in a single package. In another embodiment, chip scale packaging may be used. In chip scale packaging, the two contacts of the semiconductor workpiece are made accessible on the bottom of the package, reducing the size of the package and allowing greater packing density.

In another embodiment, the collimation of the light emitted from the red LEDs may be improved. This increases the amount of distance that may exist between the LED and the substrate. For example, for Lambertian reflectance, the light intensity decreases as the square of distance. In other words, intensity is proportional to $1/r^2$. Thus, moving the substrate from one inch away from the LED to two inches away from the substrate reduces the light intensity by a factor of 4!

By collimating the light output from each LED, this relationship between intensity and distance may be made closer to inversely proportional (i.e. intensity is proportional to $1/r$). In one embodiment, red LEDS may be packaged with integrated collimating optics. In another embodiment, collimating optics may be installed on the red LEDs after they are installed on a printed circuit board. The collimating optics may reduce the scattering of the light emitted from the red LED so as to focus it in a more coherent beam. In certain embodiments, the collimating optics comprises one or more lenses that are disposed proximate the LED to redirect the scatter light from the LED into a more coherent light beam. The shape of the lens may vary and be tailored for a particular use. In other embodiments, the collimating optics may be reflective elements. Thus, refractive and/or reflective elements may be used to form the collimating optics.

Figure 6:
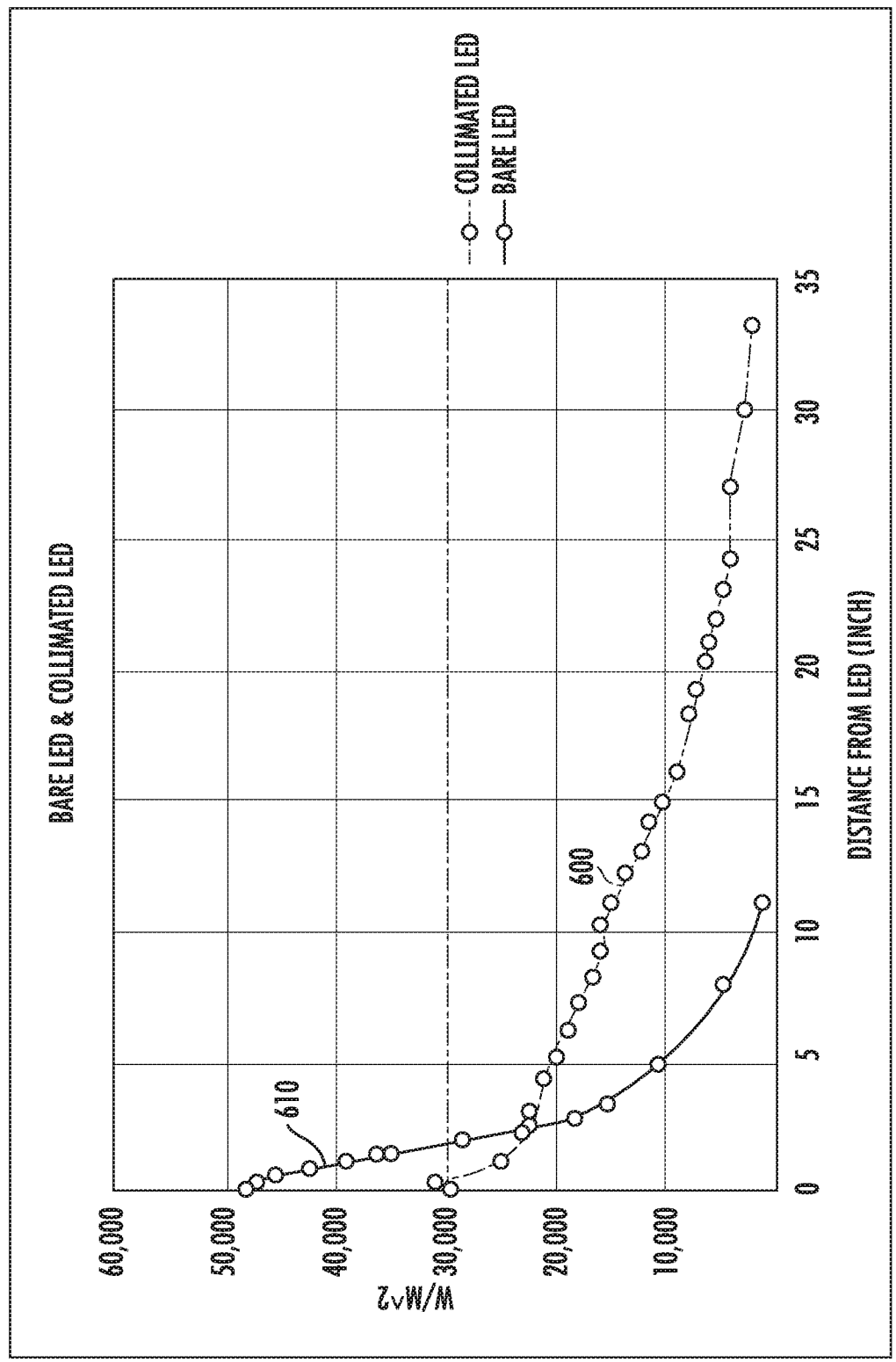
FIG. 6 shows the effect of collimation on light flux as a function of distance.

FIG. 6 shows a comparison of the flux received from a typical LED array and an LED array that utilizes collimating optics. Line 600 shows the slow decrease in flux as the distance from the LED increases which results from the use of collimating optics. In contrast, line 610 shows the rapid decrease in flux when a traditional LED array is used. Note that, as shown in line 610, the flux is much greater when the LED array is very close to the substrate. However, once the substrate is more than two inches away, the flux is much less. Thus, the use of collimating optics allows the placement of the LED array to be further away from the substrate than would be possible with a traditional LED array.

Figure 7:
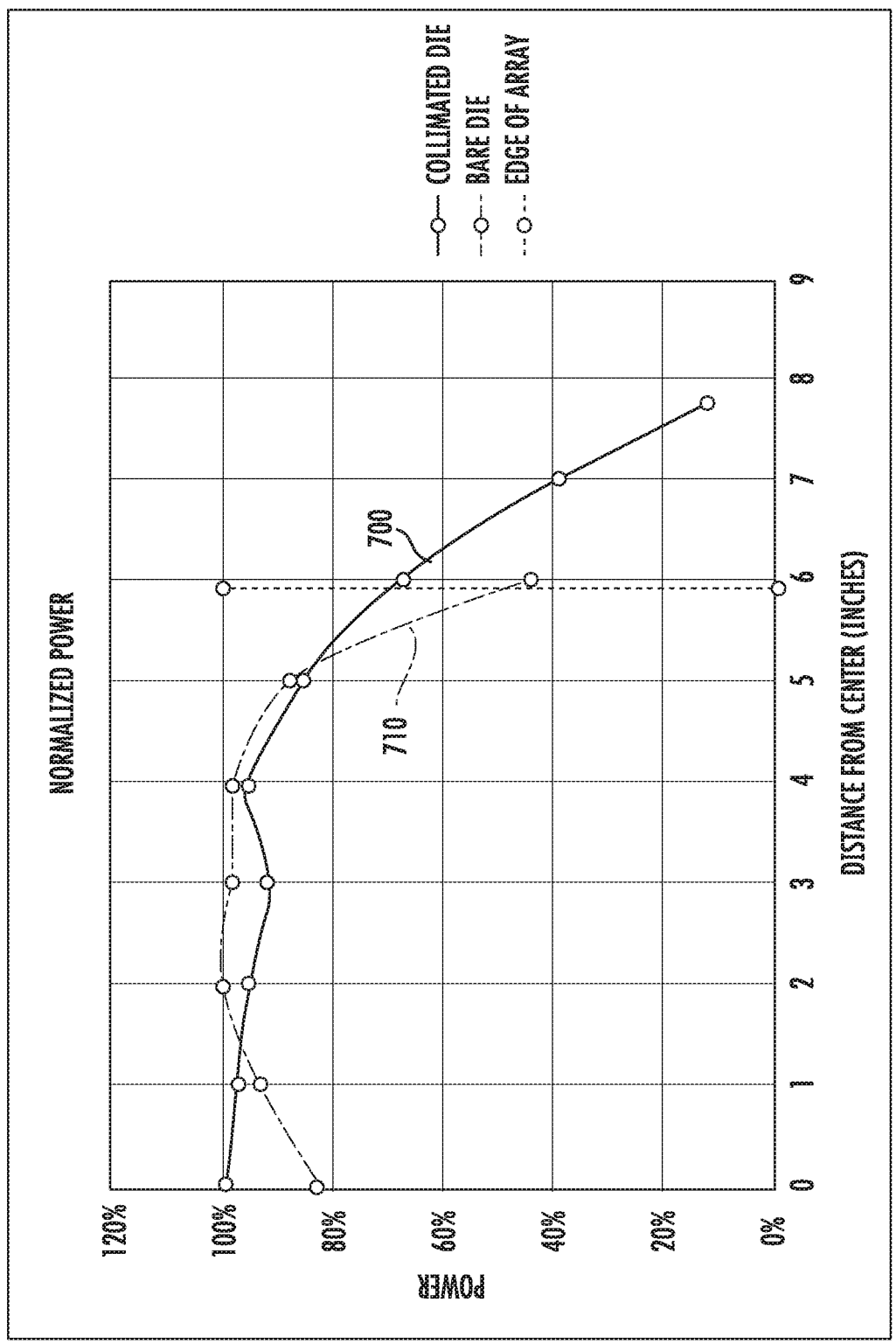
FIG. 7 shows the effect of collimation on uniformity.

Collimation also helps improve uniformity as a function of distance from the center of the substrate. FIG. 7 shows a graph representing normalized power for a collimated light source and a traditional light source. The traditional light source is a LED array while the collimated light source is an LED array with collimating optics. Line 700 shows that the light power from the collimated light source remains above 90% of its maximum value until a distance of 4 inches from center. From 4 inches to the edge of the substrate, the power decreases to about 65% of its maximum value. In contrast, as shown by line 710, the traditional light has more variation, especially near the center of the substrate, where the power is only about 80% of the maximum power. Further, the power near the outer edge is at 45% of the maximum power. Thus, in addition to allowing the LED array to be disposed further from the substrate, the use of collimating optics also improves the uniformity of the light power.

Thus, the packaging of the red LEDs may be achieved in a variety of ways. The packaging of the red LEDs is not limited to only the embodiments disclosed herein. Further, the individual red LEDs may be assembled into larger arrays.

Figure 3:
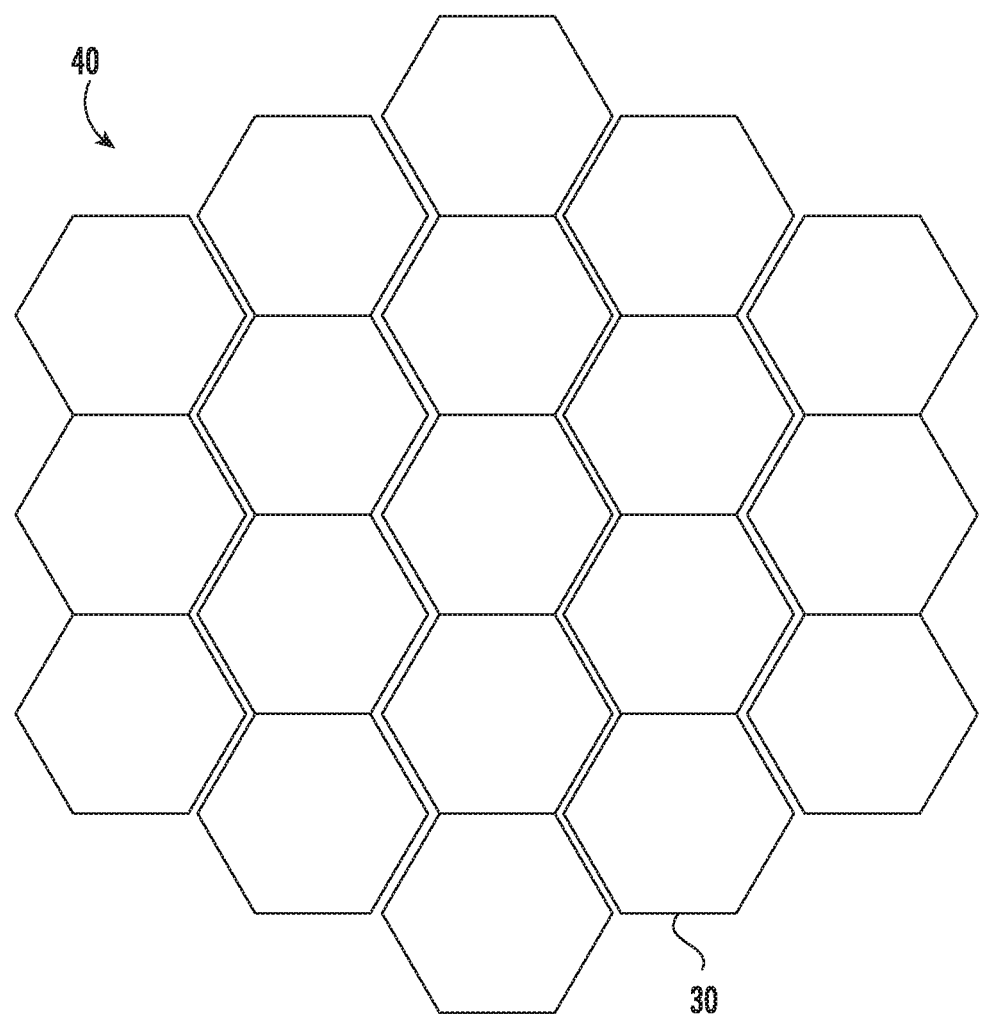
FIG. 3 shows a LED array made up of hexagon shaped tiles.

For example, the red LEDs described herein may be assembled into an LED array 40. In one embodiment, shown in FIG. 3, the red LEDs are arranged as hexagon shaped tiles 30. A plurality of these hexagon shaped tiles 30 may be nested together to form a LED array 40. In certain embodiments, each of the hexagon shaped tiles 30 may be a separate zone that can be independently controlled. In other words, each hexagon shaped tile 30 may be powered at a power level independent of every other hexagon shaped tile 30. In certain embodiments, a group of hexagon shaped tiles 30 may be grouped together to form a larger zone. For example, the hexagon shaped tiles 30 near the outer edge may be powered at a higher power level than those near the center of the LED array 40. Of course, the power level applied to each hexagon shaped tile 30 is an implementation decision and is not limited by the present disclosure.

The hexagon shaped tiles 30 nest together and provide an efficient packing density that provides uniform thermal response in the substrate when tuned correctly. The hexagon shaped tiles 30 also provide a method to deal with the inherent tolerances associated with high volume LED production. Typical die from a given lot can vary +/−5% in light output. Designing a large LED heater with thousands of die, that provides uniform light output, is quite troublesome. The hexagon shaped tiles 30, each with several dozen die, can be calibrated in an integrating sphere. Each hexagon shaped tile 30 is placed in the sphere and the power vs input power is mapped. Those maps are loaded into the control software to provide a uniform power output for the entire LED array 40 of hexagon shaped tiles 30.

In one embodiment, off the shelf die that are not binned may be used. In this case, each hexagon shaped tile 30 of the LED array 40 is calibrated so that the resulting array provides uniform lighting. This technique of calibrating each hexagon shaped tile 30 also helps maintenance of the LED array 40. For example, if a hexagon shaped tile 30 fails or starts to fail, it can be replaced instead of replacing the entire LED array 40. When one hexagon shaped tile 30 is replaced, the new power output map is also replaced. This process may insure that the light output from the entire LED array 40 remains uniform.

Further, the red LEDs may be configured in different shaped tiles, such as squares, rectangles, circles, pentagons, or any other desired shape. Further, in another embodiment, the red LEDs may be arranged in concentric rings such that the power applied at a certain distance from the center can be tuned to provide thermal uniformity on the target substrate.

Other techniques may also be used to improve uniformity. In one embodiment, a diffuser may be disposed between the LED array 40 and the substrate. The diffuser may be a translucent material that serves to homogenize the light emitted from the LED array.

Figure 4A:
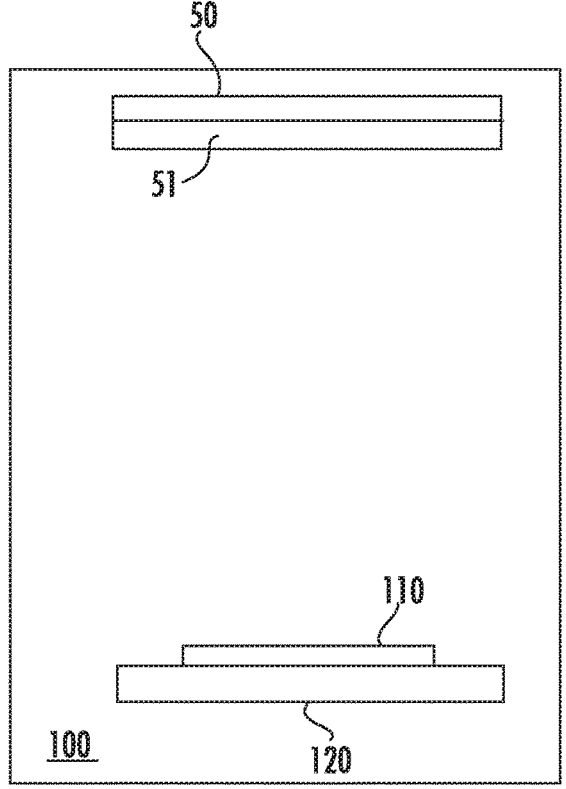
FIG. 4A shows a preheat chamber using the red LED array according to one embodiment.

FIG. 4A shows a heating system. The heating system comprises a processing chamber 100 which may be used to process a silicon carbide substrate 110. In certain embodiments, the processing chamber 100 is used exclusively to heat the silicon carbide substrate 110. In other embodiments, another semiconductor process, such as implantation, may also be performed in the processing chamber 100.

A heating element 50 may be disposed within the processing chamber 100. The heating element 50 may comprise one or more red LEDs. As described above in FIG. 3, in certain embodiments, the heating element 50 may be a LED array 40 that is comprised of hexagon shaped tiles 30 of red LEDs. The silicon carbide substrate 110 may be supported by a support 120. This support 120 may be movable. For example, the support 120 may be used to transport the silicon carbide substrate 110 from a load lock or other port to its processing position. In other embodiments, the support 120 may be capable of vertical movement. In certain embodiments, the support 120 may be stationary.

In the embodiment shown in FIG. 4A, the heating element 50 may be disposed on or near a top surface of the processing chamber 100. In some embodiments, the heating element 50 may be attached to the top surface of the processing chamber 100. In other embodiments, the heating element 50 may be supported in a different manner. In another embodiment, the heating element 50 may be disposed beneath the silicon carbide substrate 110, as shown in FIG. 4C. Thus, in these embodiments, the heating element 50 is disposed within the processing chamber 100 with the silicon carbide substrate 110. In each of these embodiments, collimating optics 51 may be disposed between the red LEDs and the silicon carbide substrate 110. In many embodiments, the heating element 50 may be within 0.5 to 1.0 inches of the silicon carbide substrate 110. This distance may increase if collimating optics are used.

Figure 4B:
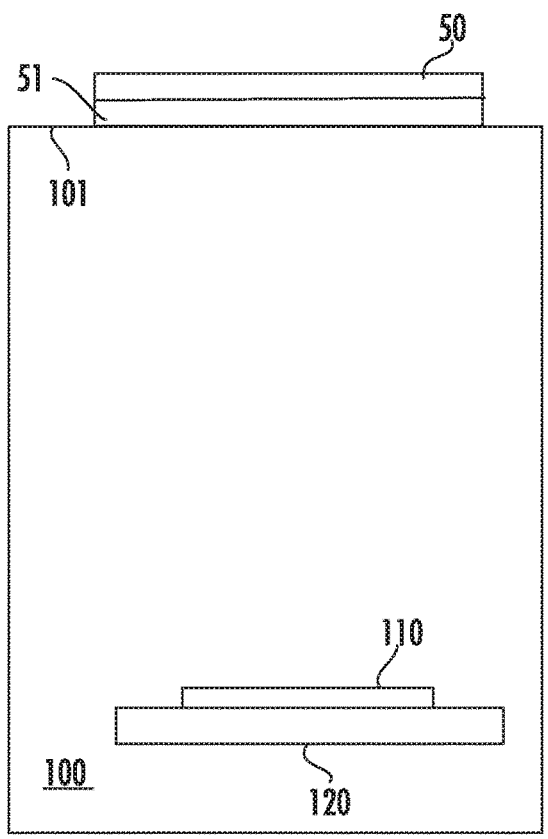
FIG. 4B shows a preheat chamber using the red LED array according to a second embodiment.
Figure 4C:
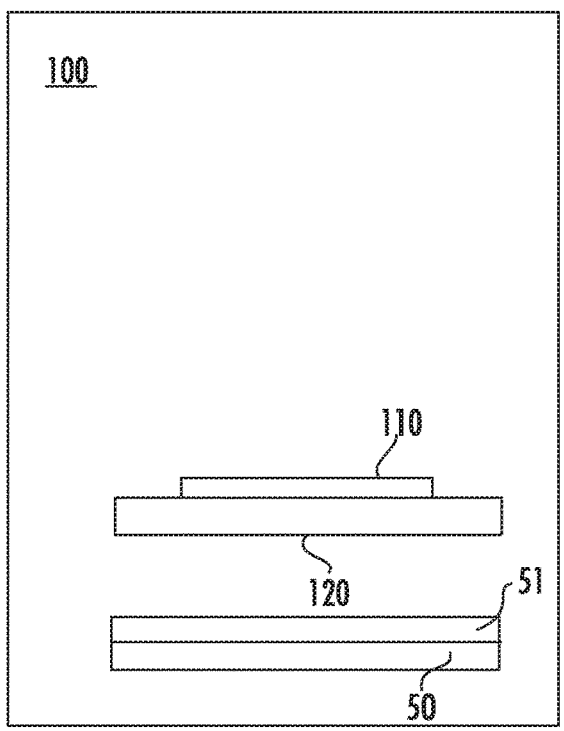
FIG. 4C shows a preheat chamber using the red LED array according to a third embodiment.

FIG. 4B shows another embodiment of a heating system where the heating element 50 is disposed outside the processing chamber 100. In this embodiment, the top surface of the processing chamber 100 may be a window 101 that is transparent at the wavelengths emitted by the red LEDs. Thus, in this embodiment, the processing chamber 100 may be maintained at vacuum conditions, while the heating element 50 is disposed in atmospheric conditions. In some embodiments, collimating optics 51 may be disposed between the red LEDs and the silicon carbide substrate 110. Of course, the heating element 50 may be disposed outside the processing chamber 100 even if the processing chamber 100 is not maintained at vacuum conditions. In this embodiment, the window 101 may serve as a diffuser and improve the uniformity of the heating element 50.

FIGS. 4A-4B show the heating element 50 disposed above the silicon carbide substrate 110, however, as suggested above, other embodiments are also possible. FIG. 4C shows an embodiment where the silicon carbide substrate 110 is heated from the backside. This embodiment allows consistent heating response, independent of any film that has been applied to the top surface of the substrate.

Figure 4D:
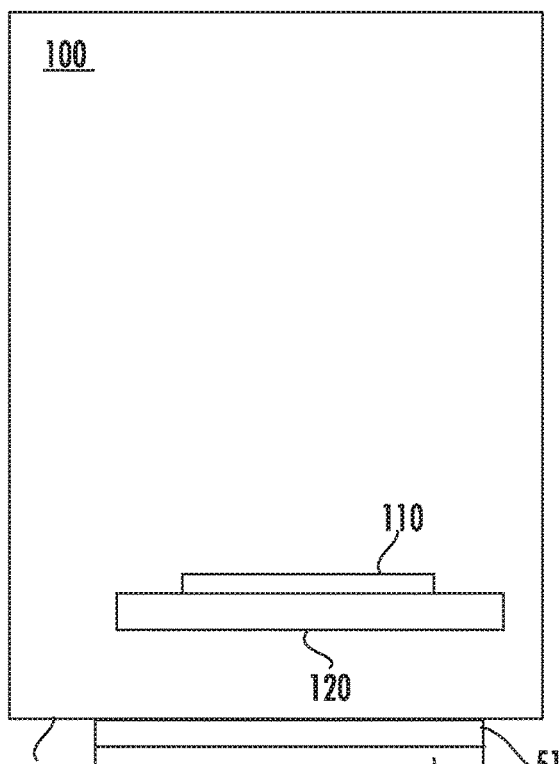
FIG. 4D shows a preheat chamber using the red LED array according to a fourth embodiment.

FIG. 4D shows another embodiment of a heating system where the heating element 50 is disposed outside the processing chamber 100. In this embodiment, the bottom surface of the processing chamber 100 may be a window 101 that is transparent at the wavelengths emitted by the red LEDs. Thus, in this embodiment, the processing chamber 100 may be maintained at vacuum conditions, while the heating element 50 is disposed in atmospheric conditions. In some embodiments, collimating optics 51 may be disposed between the red LEDs and the silicon carbide substrate 110. Of course, the heating element 50 may be disposed outside the processing chamber 100 even if the processing chamber 100 is not maintained at vacuum conditions. As was stated with respect to the embodiment of FIG. 4B, in this embodiment, the window 101 may serve as a diffuser and improve the uniformity of the heating element 50.

Figure 5:
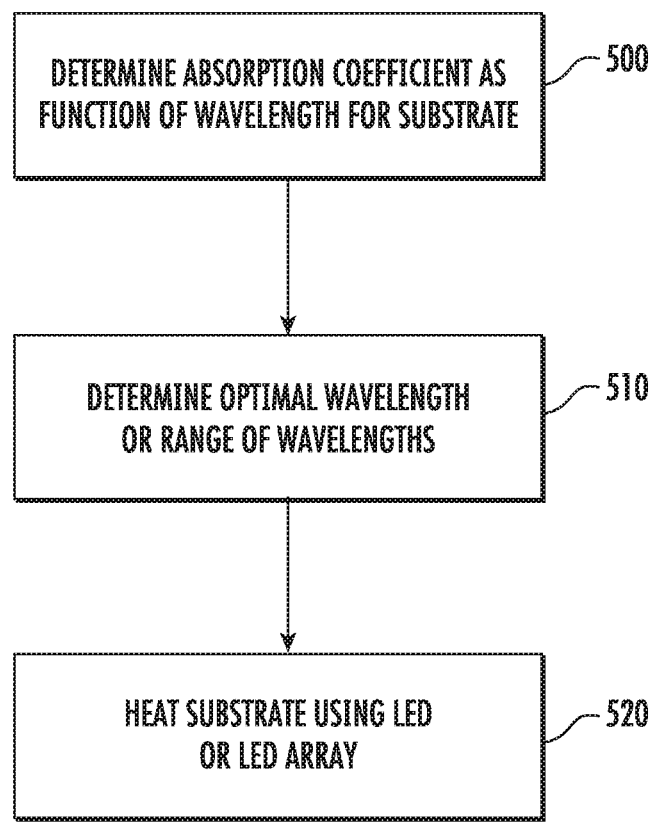
FIG. 5 shows a method of heating a substrate according to one embodiment.

While the present application describes a heating element 50 made up of red LEDs, the disclosure is not limited to this embodiment. For example, other substrates may respond different to various wavelengths, such that their coefficient of absorption is maximized at a different wavelength. Thus, the present disclosure also describes, in FIG. 5, a method of heating a substrate. First, as shown in Process 500, the absorption coefficient of the substrate, as a function is obtained. This may be achieved using publicly available information, or through empirical testing. In certain embodiments, this method is used for substrates which are not silicon substrates. For example, this method may be used for SiC substrates, GaAs substrates, GaN substrates, or other materials. Once the absorption coefficient of the substrate as a function of wavelength is determined, an optimal wavelength or range of wavelengths where the greatest absorption occurs is identified, as shown in Process 510. A LED or LED array is then actuated to emit light toward the substrate at the optimal wavelength or range of wavelengths, heating the substrate efficiently, as shown in Process 520. As described above, collimating optics may be disposed proximate the LED or LED array to increase the allowable distance between the LED array and the substrate. In one particular embodiment, the substrate is silicon carbide and the range of wavelengths is between 600 nm and 650 nm. In another embodiment, the substrate is GaAs and the range of wavelengths is between 400 nm and 450 nm. In another embodiment, the substrate is GaN and the range of wavelengths is between 400 nm and 450 nm.

In summary, the present system has many advantages. First, by selecting the color of the LED based on the absorption coefficient of the substrate, greater coupling can be achieved. This may result in faster or more efficient heating of the substrate than would be achieved using a traditional blue LED. Efficiency may be defined as the ratio of the energy delivered to the substrate divided by the power supplied at the source. Greater coupling efficiency reduces the waste energy associated with the cooling of the heating elements. The actual efficiency of blue LEDs may be as high as 15%. Other light sources, such as red LEDs and lamp heaters, may have efficiencies of closer to 5%.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A heating system, comprising:
a silicon carbide substrate; and
a heating element, wherein the heating element comprises one or more light emitting diodes (LEDs) that emits light at a wavelength between 600 nm and 650 nm, wherein the wavelength is selected based on an absorption coefficient of the silicon carbide substrate.

2. The heating system of claim 1, wherein the heating element comprises a plurality of hexagon shaped tiles, each tile comprising a plurality of LEDs.

3. The heating system of claim 2, wherein each of the plurality of hexagon shaped tiles is calibrated such that all of the plurality of hexagon shaped tiles emits an equal amount of light.

4. The heating system of claim 1, wherein the LEDs are packaged in a chip scale package.

5. The heating system of claim 1, wherein collimating optics is disposed between the silicon carbide substrate and the LEDs.

6. The heating system of claim 5, wherein the collimating optics is integrated with the LEDs.

7. The heating system of claim 1, wherein a diffuser is disposed between the heating element and the silicon carbide substrate.

8. The heating system of claim 1, wherein the silicon carbide substrate is disposed in a processing chamber.

9. The heating system of claim 8, wherein the heating element is disposed in the processing chamber.

10. The heating system of claim 8, wherein the processing chamber comprises a surface having a window, and the heating element is disposed outside the processing chamber, proximate the window.

11. A method of heating a substrate, comprising:
determining an absorption coefficient of the substrate, wherein the substrate is not a silicon substrate, as a function of wavelength using publicly available information or through empirical testing;
selecting an optimal wavelength or range of wavelengths based on the absorption coefficient of the substrate; and
heating the substrate using an LED or LED array that emits light at the optimal wavelength or range of wavelengths.

12. The method of claim 11, wherein the substrate comprises silicon carbide.

13. The method of claim 11, further comprising disposing collimating optics between the LED or LED array and the substrate.

14. The method of claim 13, wherein the collimating optics is integrated with the LED or LED array.

15. The method of claim 11, wherein the substrate is disposed within a processing chamber, the processing chamber comprising a window that is transparent at the optimal wavelength or range of wavelengths and the LED or LED array is disposed outside the processing chamber proximate the window.

16. The method of claim 11, further comprising disposing a diffuser between the LED or LED array and the substrate.

17. A heating system, comprising:
a processing chamber adapted to hold a silicon carbide substrate; and
a plurality of hexagon shaped tiles, each tile comprising a plurality of LEDs, wherein the plurality of LEDs emit light at a wavelength between 600 nm and 650 nm, wherein the wavelength is selected based on an absorption coefficient of the silicon carbide substrate.

18. The heating system of claim 17, wherein collimating optics are disposed between the plurality of LEDS and the silicon carbide substrate.

19. The heating system of claim 17, wherein the plurality of hexagon shaped tiles is disposed outside the processing chamber.

* * * * *